(12) United States Patent
Payne

(10) Patent No.: US 7,688,125 B2
(45) Date of Patent: Mar. 30, 2010

(54) LATCHED COMPARATOR AND METHODS FOR USING SUCH

(75) Inventor: Robert F. Payne, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 49 days.

(21) Appl. No.: 11/626,860

(22) Filed: Jan. 25, 2007

(65) Prior Publication Data

US 2008/0143411 A1    Jun. 19, 2008

Related U.S. Application Data

(60) Provisional application No. 60/870,833, filed on Dec. 19, 2006.

(51) Int. Cl.
*H03K 3/289* (2006.01)
*H03K 3/356* (2006.01)

(52) U.S. Cl. ............... 327/203; 327/199; 327/200; 327/201; 327/202

(58) Field of Classification Search .......... 327/199–218, 327/52, 53, 58, 60, 62, 63, 65–69, 71, 72, 327/74, 77–81, 88, 89, 115, 116, 117, 118, 327/355–360, 202, 203, 208–215; 377/47, 377/48
See application file for complete search history.

(56) References Cited

U.S. PATENT DOCUMENTS

| 4,147,943 | A |   | 4/1979  | Peterson |            |
|-----------|---|---|---------|----------|------------|
| 5,079,452 | A | * | 1/1992  | Lain et al. | 327/223 |
| 5,216,276 | A | * | 6/1993  | Takada   | 257/588    |
| 5,933,771 | A |   | 8/1999  | Tiller et al. |       |
| 7,202,708 | B2| * | 4/2007  | Luh et al. | 327/77   |
| 2006/0255859 | A1 | | 11/2006 | Zanchi et al. |     |

* cited by examiner

*Primary Examiner*—Lincoln Donovan
*Assistant Examiner*—Brandon S Cole
(74) *Attorney, Agent, or Firm*—John J. Patti; Wade J. Brady, III; Frederick J. Telecky, Jr.

(57) ABSTRACT

Various systems and methods for comparing signals are disclosed herein. For example, some embodiments of the present invention provide comparator circuits with a preamplifier circuit, a latch circuit and a current re-use circuit. The current re-use circuit applies a current to the preamplifier circuit during a transparent phase, and applies a similar current to the latch circuit during a latch phase.

20 Claims, 5 Drawing Sheets

LATCHED COMPARATOR AND METHODS FOR USING SUCH

CROSS REFERENCE TO RELATED APPLICATIONS

The present application claims priority to (is a non-provisional filing of) U.S. Provisional Patent Application No. 60/870,833 entitled "LATCHED COMPARATOR AND METHODS FOR USING SUCH" and filed Dec. 19, 2006 by Payne. The aforementioned application is assigned to an entity common hereto and is incorporated herein by reference for all purposes.

BACKGROUND OF THE INVENTION

The present invention is related to comparators, and more particularly to high speed latching comparators.

Various comparators have been developed that allow for comparing two analog input signals and providing a digital output signal indicating the result of the comparison. FIG. 1 shows one such latched comparator circuit 100 that includes both a pre-amplifier and a latch. In operation, a bias voltage 178 (VBB1) is applied to a transistor 136 that causes a tail current to traverse from a rail voltage VDD 172 to a ground VSS 180 via a bias resistor 110. Each of two voltage inputs are applied to respective ones of an input IN 174 and an input INZ 176. The voltage at the collector of transistor 132 is replicated (i.e., less a base to emitter voltage drop) at the emitter of a transistor 142 that is configured as an emitter follower. Similarly, the voltage at the collector of transistor 134 is replicated (i.e., less a base to emitter voltage drop) at the emitter of a transistor 144 that is configured as an emitter follower. Transistor 142 is biased by a transistor 138 and resistor 112, and transistor 144 is biased by a transistor 140 and resistor 114. The emitter of transistor 142 and the emitter of transistor 144 are coupled to respective inputs of a differential input pair 147. In particular, the emitter of transistor 142 is electrically coupled to the base of a transistor 148, and the emitter of transistor 144 is electrically coupled to the base of a transistor 146. Thus, the respective voltages at the collectors of transistor 132 and transistor 134 are replicated (less a base to emitter voltage drop) on the respective bases of transistor 146 and transistor 148.

Whenever a clock input 192 (CK) is asserted high with respect to clock input 194 (CKZ), current is steered through differential input pair 147 in a fashion dependent upon the relative assertion levels of IN 174 and INZ 176. In particular, differential input pair 147 is biased by a transistor 154, a resistor 116 and voltage VBB1; and a tail current generated by the bias is differentially steered through transistor 146 and transistor 148 in proportion to the relative assertion levels of IN 174 and INZ 176. This results in a differential voltage across the collectors of transistor 146 and transistor 148. This differential voltage is applied across the base of a transistor 160 and the base of a transistor 162. The emitter of transistor 160 is electrically coupled to a comparator output 187 (OUTB), and the emitter of transistor 162 is electrically coupled to a comparator output 189 (OUTA). Together OUTA 189 and OUTB 187 operate as a differential output. Transistor 160 is biased by a transistor 164, a resistor 118 and VBB1, and transistor 162 is biased by a transistor 166, a resistor 120 and VBB1.

OUTA 189 and OUTB 187 are fed back to a differential input pair 157. In particular, OUTA 189 is electrically coupled to the base of a transistor 156, and OUTB 187 is electrically coupled to the base of a transistor 158. When CKZ 194 is asserted high (i.e., when CK 192 is asserted low), the tail current produced by transistor 154 and resistor 116 is steered through differential input pair 157 via a transistor 152. This results in a positive feedback of OUTA 189 and OUTB 187 that causes the aforementioned outputs to be latched. Thus, when CK 192 is asserted high, latched comparator circuit 100 is transparent, and when CK 192 is asserted low latch comparator circuit 100 latches the data.

In operation, when IN 174 is much greater than INZ 176, the tail current set up by transistor 136 is steered through transistor 132 and a resistor 102. Thus, the collector of transistor 134 is driven to approximately the level of VDD 172, and the collector of transistor 132 is driven to a lower voltage level (i.e., $VDD - I_{tail} * R_{102}$). This voltage difference is replicated across the bases of transistor 146 and transistor 148 as set forth in the following equations:

$$V_{b,148} = VDD - I_{tail} * R_{102} - V_{be}, \text{ and}$$

$$V_{b,146} = VDD - V_{be}.$$

When CK 192 is asserted high, the aforementioned voltages are reflected at OUTA 189 and OUTB 187 according to the following equations:

$$OUTA189 = VDD - V_{be}, \text{ and}$$

$$OUTB187 = VDD - I_{tail} * R_{108} - V_{be}, \text{ assuming } I_{tail} \text{ is the same in all legs of the circuit.}$$

When CK 192 is asserted low, OUTA 189 and OUTB 187 are latched via a positive feedback loop including differential input pair 157.

In contrast, when IN 174 is much less than INZ 176 the tail current set up by transistor 136 is steered through transistor 134 and a resistor 104. Thus, the collector of transistor 132 is driven to approximately the level of VDD 172, and the collector of transistor 134 is driven to a lower voltage level (i.e., $VDD - I_{tail} * R_{104}$). This voltage difference is replicated across the bases of transistor 146 and transistor 148 as set forth in the following equations:

$$V_{b,148} = VDD - V_{be}, \text{ and}$$

$$V_{b,146} = VDD - I_{tail} * R_{104} - V_{be}.$$

When CK 192 is asserted high, the aforementioned voltages are reflected at OUTA 189 and OUTB 187 according to the following equations:

$$OUTA189 = VDD - I_{tail} * R_{106} - V_{be}, \text{ and}$$

$$OUTB187 = VDD - V_{be}, \text{ assuming } I_{tail} \text{ is the same in all legs of the circuit.}$$

When CK 192 is asserted low, OUTA 189 and OUTB 187 are latched via a positive feedback loop including differential input pair 157.

As will be appreciated, transistors 142, 144 provide a valuable pre-amplifier function, that while useful consumes considerable power during operation of the previously described latched comparator circuit. Such power consumption is undesirable. Hence, for at least the aforementioned reasons, there exists a need in the art for advanced systems and methods for implementing comparators.

BRIEF SUMMARY OF THE INVENTION

The present invention is related to comparators, and more particularly to high speed latching comparators.

Some embodiments of the present invention provide comparator circuits with a preamplifier circuit, a latch circuit and a current re-use circuit. The current re-use circuit applies a current to the preamplifier circuit during a transparent phase, and applies the current to the latch circuit during a latch phase. In some cases, the circuit includes a differential input that is operable to provide a differential current in proportion to a difference between a first input and a second input. In such cases, the current re-use circuit applies the differential current to the preamplifier circuit during the transparent phase, and wherein the current re-use circuit applies the differential current to the latch circuit during the latch phase. In some such cases, the latch circuit includes a differential output, and includes a positive feedback loop driving the differential output. In various cases, the circuit receives a clock signal and the current re-use circuit includes two transistor pairs. One of the transistors of each of the transistor pairs are on when the clock signal is asserted, and the other transistor of each of the transistor pairs are on when the clock signal is de-asserted. In some instances of the aforementioned embodiments, the clock is asserted high and de-asserted low, while in other instances of the aforementioned embodiments, the clock is asserted low and de-asserted high.

Other embodiments of the present invention provide methods for latching an input signal. Such methods include providing a latched comparator circuit that includes a clock input, a data input and a latch output. The latched comparator circuit further includes: a preamplifier circuit; a latch circuit; and a current re-use circuit. The methods further include asserting the clock input. Upon asserting the clock input, the current re-use circuit applies a current to the preamplifier circuit, and the data input is reflected at the latch output. The clock input is later de-asserted, whereupon the current re-use circuit applies the current to the latch circuit, and the latch output is maintained regardless of the state of the data input. In some cases of the aforementioned embodiments, the current re-use circuit includes a first transistor pair and a second transistor pair. A first transistor of the first transistor pair and a first transistor of the second transistor pair are on when the clock input is asserted, and a second transistor of the first transistor pair and a second transistor of the second transistor pair are on when the clock input is de-asserted. In some instances of the aforementioned embodiments, the latch circuit includes a differential output, and the latch circuit includes a positive feedback loop driving the differential output.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIGS. 3b-3c show current flow during operational phases of the latched comparator circuit of FIG. 3a.

DETAILED DESCRIPTION OF THE INVENTION

The present invention is related to comparators, and more particularly to high speed latching comparators.

Figure 1:
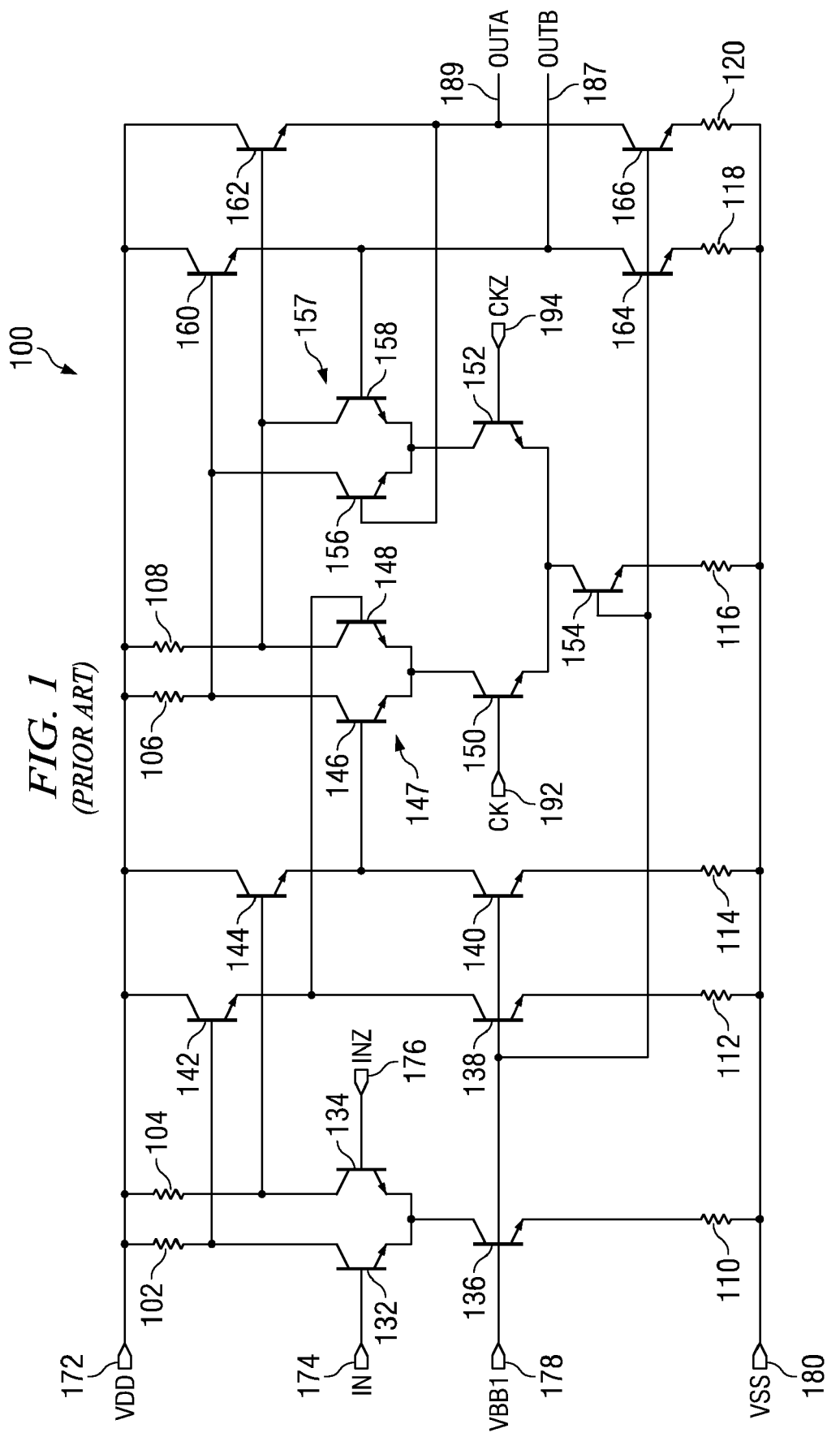
FIG. 1 shows an exemplary prior art latched comparator circuit.
Figure 2:
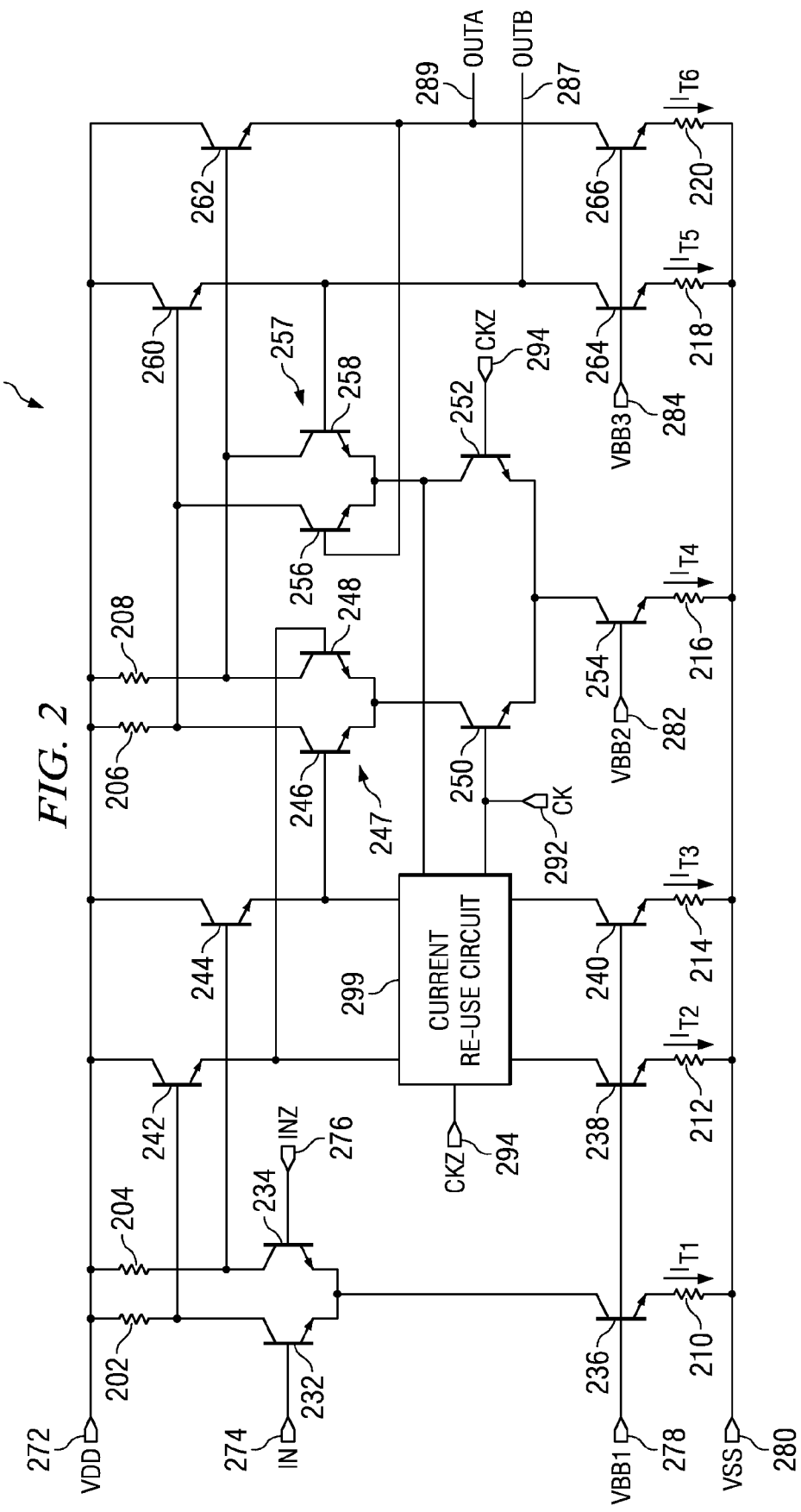
FIG. 2 shows a latched comparator circuit in accordance with one or more embodiments of the present invention.

Turning to FIG. 2, a latched comparator circuit 200 in accordance with one or more embodiments of the present invention is shown. Latched comparator circuit 200 includes a pre-amplifier including a transistor 242 and a transistor 244 configured as emitter followers, and a differential input pair 247. In addition, latched comparator circuit 200 includes a latch circuit including a differential input pair 257 configured as a positive feedback loop. Latched comparator circuit 200 includes a current re-use circuit 299 that minimizes power consumption in the pre-amplifier, and maximizes current availability in the latch circuit. As one of various advantages, both power consumption and bandwidth are improved when compared to existing latched comparator circuits. Based on the disclosure provided herein, one of ordinary skill in the art will appreciate a variety of other advantages that may be had through use of one or more circuits in accordance with the various embodiments of the present invention.

In operation, a bias voltage 278 (VBB1) is applied to a transistor 236 that causes a tail current ($I_{T1}$) to traverse from a rail voltage 272 (VDD) to a ground 280 (VSS) via a bias resistor 210. Similarly, VBB1 278 is applied to a transistor 238 and a transistor 240 that causes respective tail currents ($I_{T2}$, $I_{T3}$) to traverse from VDD 272 to VSS 280 via a bias resistor 212 and a bias resistor 214. A bias voltage 282 (VBB2) is applied to a transistor 254 that causes a tail current ($I_{T4}$) to traverse from VDD 272 to VSS 280 via a bias resistor 216. A bias voltage 284 (VBB3) is applied to a transistor 254 and a transistor 266 that causes respective tail currents ($I_{T5}$, $I_{T6}$) to traverse from VDD 272 to VSS 280 via a bias resistor 218 and a bias resistor 220. In some embodiments of the present invention, VBB1 278, VBB2 280 and VBB3 284 are electrically coupled to one another and are thus biased at the same voltage level. Based on the disclosure provided herein, one of ordinary skill in the art will appreciate that the aforementioned bias circuits may be replaced by other current sources as are known in the art.

Each of two voltage inputs are applied to respective ones of an input IN 274 and an input INZ 276. The voltage at the collector of transistor 232 is replicated (i.e., less a base to emitter voltage drop) at the emitter of a transistor 242 that is configured as an emitter follower. Similarly, the voltage at the collector of transistor 234 is replicated (i.e., less a base to emitter voltage drop) at the emitter of a transistor 244 that is configured as an emitter follower. Current re-use circuit 299 is biased by transistor 238 and transistor 240. The emitter of transistor 242 and the emitter of transistor 244 are electrically coupled to respective inputs of a differential input pair 247. In particular, the emitter of transistor 242 is electrically coupled to the base of a transistor 248, and the emitter of transistor 244 is electrically coupled to the base of a transistor 246. Thus, the pre-amplified differential across IN 274 and INZ 276 is replicated across the respective bases of transistor 246 and transistor 248.

Whenever a clock input 292 (CK) is asserted high with respect to clock input 294 (CKZ), $I_{T4}$ is steered through differential input pair 247 in a fashion dependent upon the relative assertion levels of IN 274 and INZ 276. This results in a differential voltage across the collectors of transistor 246 and transistor 248. This differential voltage is applied across the base of a transistor 260 and the base of a transistor 262. The emitter of transistor 260 is electrically coupled to a comparator output 287 (OUTB), and the emitter of transistor 262 is electrically coupled to a comparator output 289 (OUTA). Together OUTB 287 and OUTA 289 operate as a differential output.

OUTB 287 and OUTA 289 are fed back to a differential input pair 257. In particular, OUTA 289 is electrically coupled to the base of a transistor 268, and OUTB 287 is electrically coupled to the base of a transistor 258. When CKZ 294 is asserted high (i.e., when CK 292 is asserted low), the aggregate of $I_{T2}$, $I_{T3}$ and $I_{T4}$ is steered through differential input pair 257. This results in a positive feedback of OUTA 289 and OUTB 287 that causes the aforementioned outputs to be latched. Thus, when CK 292 is asserted high, latched comparator circuit 200 is transparent, and when CK 292 is asserted low latch comparator circuit 200 latches the data.

In operation, when CK 292 is asserted high, current re-use circuit 299 causes $I_{T2}$ to traverse transistor 242 and $I_{T3}$ to traverse transistor 244. Thus, current is provided to the pre-amplifier circuit. In contrast, when CK 292 is asserted low, current re-use circuit 299 causes the combination of $I_{T2}$ and $I_{T3}$ to traverse differential pair transistor 257. Thus, the aforementioned tail currents are re-used in the latch circuit. By doing this, the tail currents are made available for the pre-amplifier during the transparent operation of latched comparator 200, but are not wasted during the latched operation of latched comparator 200. This improves both the power performance and the bandwidth.

When IN 274 is much greater than INZ 276, $I_{T1}$ is steered through transistor 232 and a resistor 202. Thus, the collector of transistor 234 is driven to approximately the level of VDD 272, and the collector of transistor 232 is driven to a lower voltage level (i.e., VDD–$I_{T1}$*$R_{202}$). This voltage difference is replicated across the bases of transistor 246 and transistor 248 as set forth in the following equations:

$V_{b,248} = VDD - I_{T1}*R_{202} - V_{be}$, and $V_{b,246} = VDD - V_{be}$.

When CK 292 is asserted high, the aforementioned voltages are reflected at OUTA 289 and OUTB 287 according to the following equations:

$OUTA289 = VDD - V_{be}$, and $OUTB287 = VDD - I_{T4}*R_{206} - V_{be}$.

When CK 292 is asserted low, OUTA 289 and OUTB 287 are latched via a positive feedback loop including differential input pair 257 as described by the following equations:

$OUTA289 = VDD - V_{be}$, and $OUTB287 = VDD - (I_{T2}+I_{T3}+I_{T4})R_{206} - V_{be}$.

In contrast, when IN 274 is much less than INZ 276 $I_{T1}$ is steered through transistor 234 and a resistor 204. Thus, the collector of transistor 232 is driven to approximately the level of VDD 272, and the collector of transistor 234 is driven to a lower voltage level (i.e., VDD–$I_{T1}$*$R_{204}$). This voltage difference is replicated across the bases of transistor 246 and transistor 248 as set forth in the following equations:

$V_{b,248} = VDD - V_{be}$, and $V_{b,246} = VDD - I_{T1}*R_{204} - V_{be}$.

When CK 292 is asserted high, the aforementioned voltages are reflected at OUTA 289 and OUTB 287 according to the following equations:

$OUTA289 = VDD - I_{T4}*R_{208} - V_{be}$, and $OUTB287 = VDD - V_{be}$.

When CK 292 is asserted low, OUTA 289 and OUTB 287 are latched via a positive feedback loop including differential input pair 257 as described by the following equations:

$OUTA289 = VDD - (I_{T2}+I_{T3}+I_{T4})R_{208} - V_{be}$, and $OUTB287 = VDD - V_{be}$.

Figure 3A:
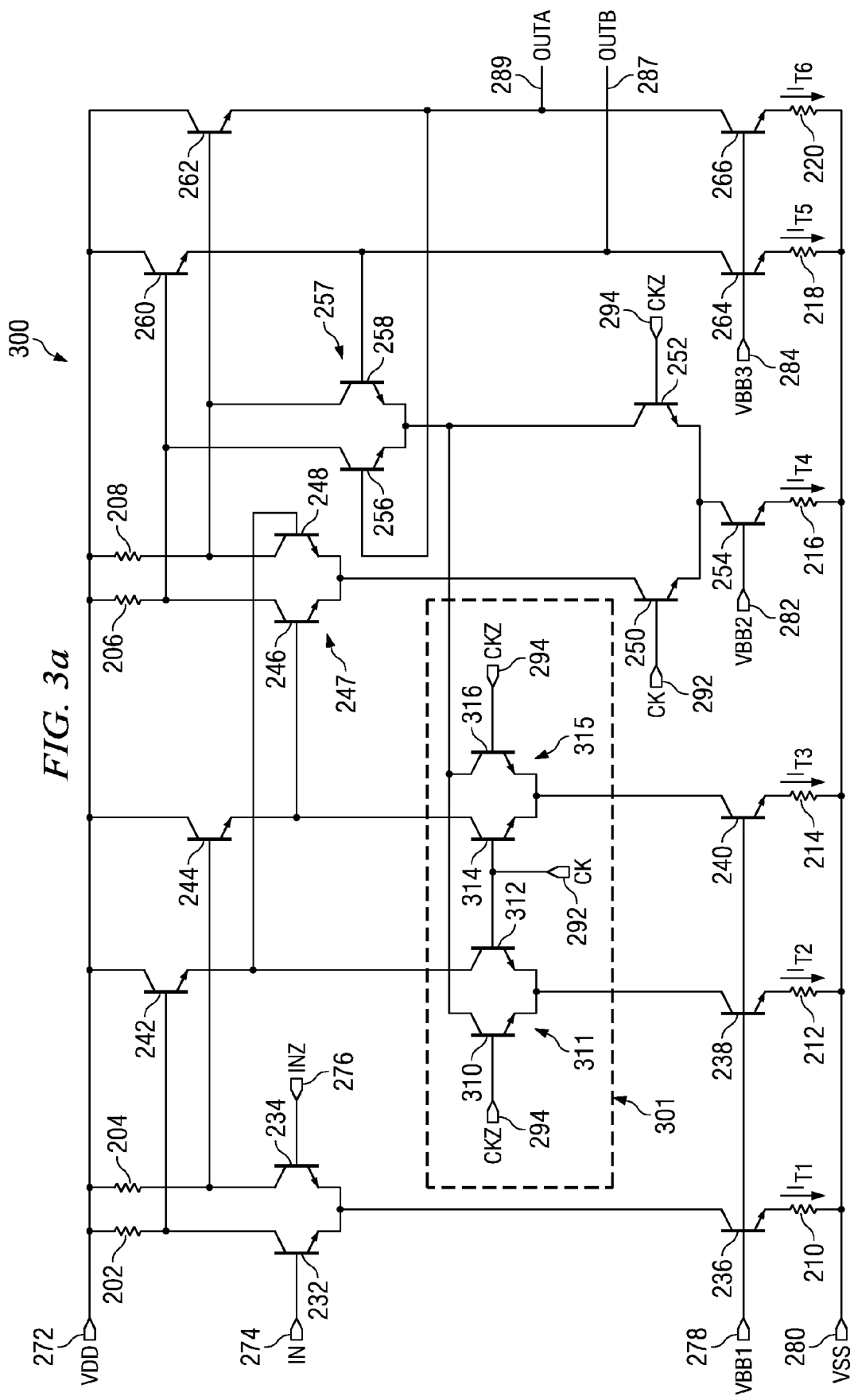
FIG. 3a shows one particular embodiment of a latched comparator circuit in accordance with the present invention.

Turning to FIG. 3a, one particular embodiment of a latched comparator circuit 300 in accordance with the present invention is shown. Latched comparator circuit 300 is similar to latched comparator circuit 200, except that current re-use circuit 299 is replaced by a circuit 301. In particular, latched comparator circuit 300 includes the pre-amplifier including transistor 242 and transistor 244 configured as emitter followers, and differential input pair 247. In addition, latched comparator circuit 300 includes the latch circuit including differential input pair 257 configured as a positive feedback loop. Latched comparator circuit 300 includes circuit 301 which is a current steering circuit. Circuit 301 includes a differential pair 311 and a differential pair 315 that steer current between the pre-amplifier circuit and the latch circuit in a way that minimizes power consumption in the pre-amplifier, and maximizes current availability in the latch circuit. As one of various advantages, both power consumption and bandwidth are improved when compared to existing latched comparator circuits. Based on the disclosure provided herein, one of ordinary skill in the art will appreciate a variety of other advantages that may be had through use of one or more circuits in accordance with the various embodiments of the present invention.

Similar to that described in relation to latched comparator circuit 200, the various tail currents ($I_{T1}$, $I_{T2}$, $I_{T3}$, $I_{T4}$ and $I_{T5}$) are created to properly bias the circuit. Again, in some embodiments of the present invention, VBB1 278, VBB2 280 and VBB3 284 are electrically coupled to one another and are thus biased at the same voltage level.

Each of two voltage inputs are applied to respective ones of an input IN 274 and an input INZ 276. The voltage at the collector of transistor 232 is replicated (i.e., less a base to emitter voltage drop) at the emitter of a transistor 242 that is configured as an emitter follower. Similarly, the voltage at the collector of transistor 234 is replicated (i.e., less a base to emitter voltage drop) at the emitter of a transistor 244 that is configured as an emitter follower. Transistor 242 is biased by transistor 238 and resistor 212, and transistor 244 is biased by a transistor 240 and resistor 214. The emitter of transistor 242 and the emitter of transistor 244 are electrically coupled to respective inputs of a differential input pair 247. In particular, the emitter of transistor 242 is electrically coupled to the base of a transistor 248, and the emitter of transistor 244 is electrically coupled to the base of a transistor 246. Thus, the pre-amplified differential across IN 274 and INZ 276 is replicated across the respective bases of transistor 246 and transistor 248.

Figure 3B:
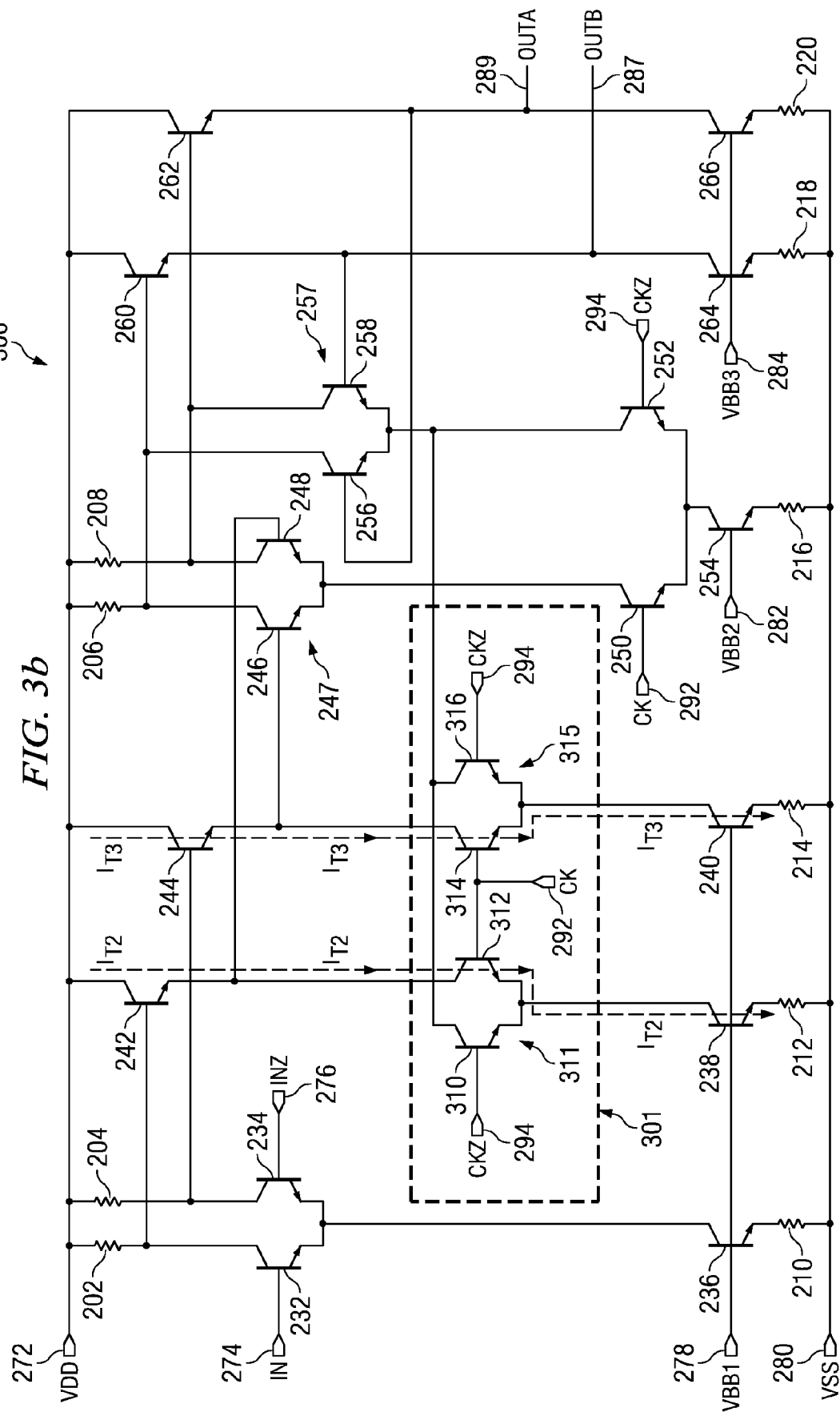
Figure 3C:
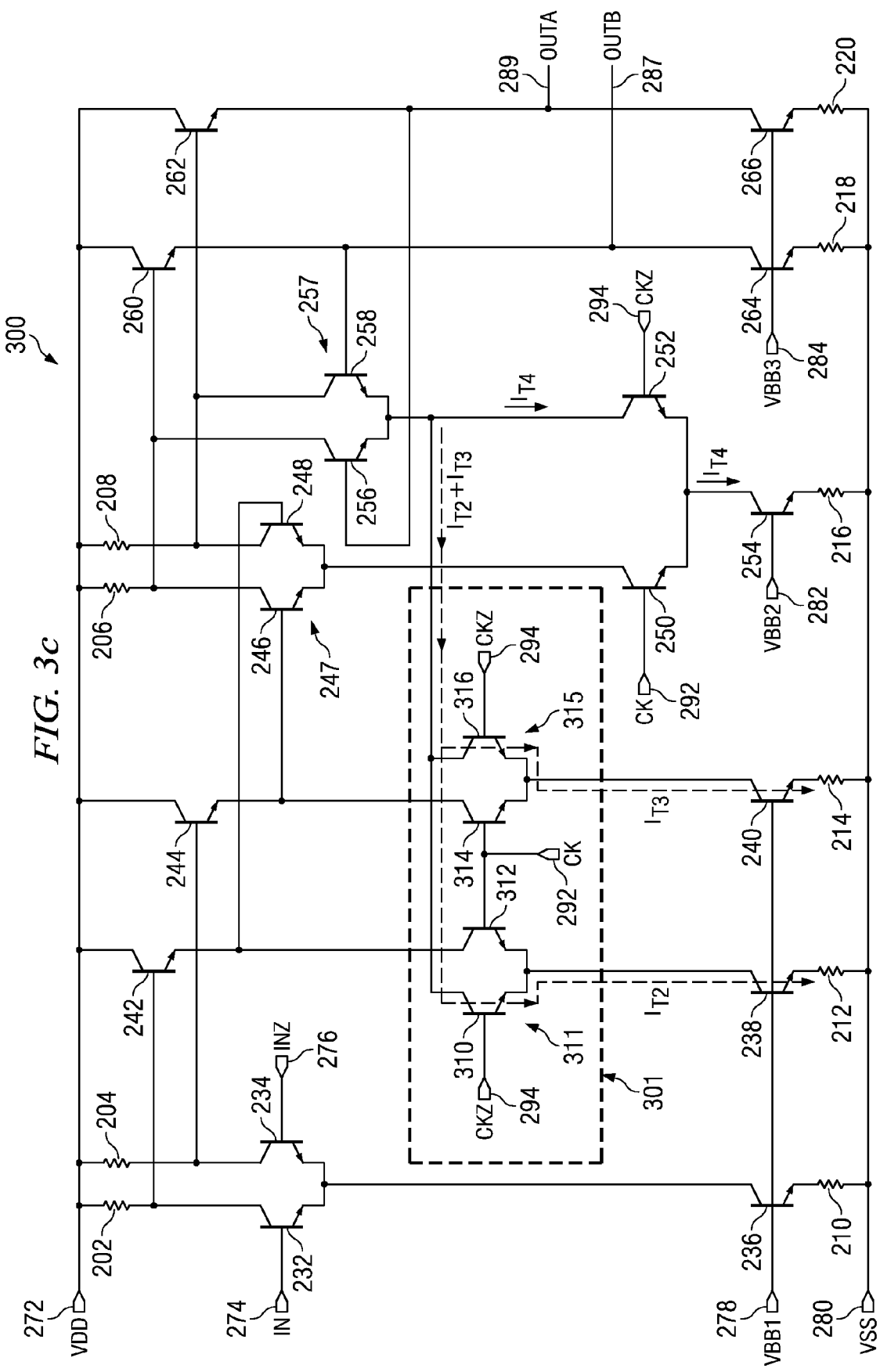

In operation, when CK 292 is asserted high, circuit 301 causes $I_{T2}$ to traverse transistor 242 and $I_{T3}$ to traverse transistor 244. This is shown in FIG. 3b using dashed lines labeled $I_{T2}$ and $I_{T3}$, respectively. Thus, the current is made available to the pre-amplifier circuit when latched comparator is in transparent mode. In particular, when CK 292 is asserted high, transistor 312 and transistor 314 are turned on, and transistor 310 and transistor 316 are turned off. This results in the current flow as discussed above. In contrast, when CK 292 is asserted low (i.e., CKZ 294 is asserted high), transistor 310 and transistor 316 are turned on, and transistor 312 and transistor 314 are turned off. This causes $I_{T2}$ and $I_{T3}$ to be re-directed to the latch circuit. This is shown in FIG. 3c using dashed lines labeled $I_{T2}$ and $I_{T3}$, respectively. Thus, tail currents $I_{T2}$ and $I_{T3}$ are made available for the pre-amplifier during the transparent operation of latched comparator 300, but are not wasted during the latched operation of latched comparator 300. This improves both the power performance and the bandwidth.

Whenever CK 292 is asserted high, $I_{T4}$ is steered through differential input pair 247 in a fashion dependent upon the relative assertion levels of IN 274 and INZ 276. This results in a differential voltage across the collectors of transistor 246 and transistor 248. This differential voltage is applied across the base of a transistor 260 and the base of a transistor 262. The emitter of transistor 260 is electrically coupled to a comparator output 287 (OUTB), and the emitter of transistor 262 is electrically coupled to a comparator output 289 (OUTA). Together OUTA 289 and OUTB 287 operate as a differential output.

OUTA 289 and OUTB 287 are fed back to a differential input pair 257. In particular, OUTA 289 is electrically coupled to the base of a transistor 256, and OUTB 287 is electrically coupled to the base of a transistor 258. When CKZ 294 is asserted high (i.e., when CK 292 is asserted low), the aggregate of $I_{T2}$, $I_{T3}$ and $I_{T4}$ is steered through differential input pair 257. This results in a positive feedback of OUTA 289 and OUTB 287 that causes the aforementioned outputs to be latched. Thus, when CK 292 is asserted high, latched comparator circuit 300 is transparent, and when CK 292 is asserted low latch comparator circuit 300 latches the data.

When IN 274 is much greater than INZ 276, $I_{T1}$ is steered through transistor 232 and a resistor 202. Thus, the collector of transistor 234 is driven to approximately the level of VDD 272, and the collector of transistor 232 is driven to a lower voltage level (i.e., $VDD-I_{T1}*R_{202}$). This voltage difference is replicated across the bases of transistor 246 and transistor 248 as set forth in the following equations:

$$V_{b,248}=VDD-I_{T1}*R_{202}-V_{be}, \text{ and}$$

$$V_{b,246}=VDD-V_{be}.$$

When CK 292 is asserted high, the aforementioned voltages are reflected at OUTA 289 and OUTB 287 according to the following equations:

$$OUTA289=VDD-V_{be}, \text{ and}$$

$$OUTB287=VDD-I_{T4}*R_{206}-V_{be}.$$

When CK 292 is asserted low, OUTA 289 and OUTB 287 are latched via a positive feedback loop including differential input pair 257 as described by the following equations:

$$OUTA289=VDD-V_{be}, \text{ and}$$

$$OUTB287=VDD-(I_{T2}+I_{T3}+I_{T4})R_{206}-V_{be}.$$

In contrast, when IN 274 is much less than INZ 276 $I_{T1}$ is steered through transistor 234 and a resistor 204. Thus, the collector of transistor 232 is driven to approximately the level of VDD 272, and the collector of transistor 234 is driven to a lower voltage level (i.e., $VDD-I_{T1}*R_{204}$). This voltage difference is replicated across the bases of transistor 246 and transistor 248 as set forth in the following equations:

$$V_{b,248}=VDD-V_{be}, \text{ and}$$

$$V_{b,246}=VDD-I_{T1}*R_{204}-V_{be}.$$

When CK 292 is asserted high, the aforementioned voltages are reflected at OUTA 289 and OUTB 287 according to the following equations:

$$OUTA289=VDD-I_{T4}*R_{208}-V_{be}, \text{ and}$$

$$OUTB287=VDD-V_{be}.$$

When CK 292 is asserted low, OUTA 289 and OUTB 287 are latched via a positive feedback loop including differential input pair 257 as described by the following equations:

$$OUTA289=VDD-(I_{T2}+I_{T3}+I_{T4})R_{208}-V_{be}, \text{ and}$$

$$OUTB287=VDD-V_{be}.$$

Embodiments of the present invention provide a variety of advantages. For example, embodiments of the present invention provide power efficient latches. Such power efficiency is achieved by re-using current from the pre-amplifier circuit in the latch circuit. In the transparent mode of the latch current is needed in the pre-amplifier circuit to maximize the bandwidth of the latch, but in the latch mode the current is no longer needed in the pre-amplifier circuit. The current is thus turned off in the pre-amplifier circuit resulting in a power savings. In some cases, the current from the pre-amplifier circuit is re-used in the latch circuit. This additional current substantially increases the gain of the latch circuit thereby reducing the resolution time and possibility for metastability. Thus, for example, where latched comparator 300 or latched comparator 200 is used in a high speed analog to digital converter, a reduced error rate would be expected due to the increased current available to the latch circuit. It should be noted that if the current in the latch circuit was permanently increased, the gain would be increased during the transparent phase, which increases the Miller capacitance seen by the pre-amplifier and lowers the total bandwidth. Further, use of one or more embodiments of the present invention may reduce the amount of charge kicked back onto the inputs of the latched comparator.

In conclusion, the present invention provides novel systems, devices, methods for implementing and using latching comparators. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A latched comparator circuit, the circuit comprising:
a voltage rail;
a differential data input having a differential input transistor pair;
a preamplifier circuit connected to the differential data input;
a latch circuit connected to the preamplifier circuit;

a current re-use circuit that is coupled to the preamplifier circuit and to the latch circuit, wherein the current re-use circuit applies a current to the preamplifier circuit during a transparent phase, and wherein the current re-use circuit applies the current to the latch circuit during a latch phase; and a current source that is coupled between the current re-use circuit and the voltage rail.

2. The circuit of claim 1, wherein the circuit receives a clock signal, wherein the transparent phase occurs when the clock signal is asserted high, and wherein the latch phase occurs when the clock signal is asserted low.

3. The circuit of claim 1, wherein the circuit receives a clock signal, and wherein the transparent phase occurs when the clock signal is asserted low.

4. The circuit of claim 1, wherein the circuit receives a clock signal, and wherein the current re-use circuit includes:
  a first transistor pair;
  a second transistor pair; and
  wherein a first transistor of the first transistor pair and a first transistor of the second transistor pair are on when the clock signal is asserted high, and wherein a second transistor of the first transistor pair and a second transistor of the second transistor pair are on when the clock signal is asserted low.

5. The circuit of claim 4, wherein current is applied to the preamplifier circuit when the clock signal is asserted high, and wherein current is applied to the latch circuit when the clock signal is asserted low.

6. The circuit of claim 4, wherein current is applied to the preamplifier circuit when the clock signal is asserted low, and wherein current is applied to the latch circuit when the clock signal is asserted high.

7. The circuit of claim 4, wherein the circuit includes a differential output.

8. The circuit of claim 7, wherein the circuit includes a differential current source electrically coupled to the first and second transistor pairs, and wherein the differential current source is steered by the current re-use circuit.

9. The circuit of claim 8, wherein the first transistor of the first transistor pair and the first transistor of the second transistor pair are electrically coupled to respective legs of the differential current source.

10. The circuit of claim 1, wherein the pre-amplifier circuit includes a transistor pair, and wherein the transistor pair is controlled based on the differential data input.

11. The circuit of claim 1, wherein the latch circuit includes a differential output, and wherein the latch circuit includes a positive feedback loop driving the differential output.

12. A method for latching an input signal, the method comprising:
  providing a latched comparator circuit, wherein the latched comparator circuit includes a clock input, a data input and a latch output, and wherein the latched comparator circuit includes:
    a voltage rail;
    a differential data input having a differential input transistor pair;
    a preamplifier circuit connected to the differential data input;
    a latch circuit connected to the preamplifier circuit;
    a current re-use circuit that is coupled to the latch circuit and to the preamplifier circuit; and
    a current source that is coupled between the current re-use circuit and the voltage rail;
  asserting the clock input, wherein the current re-use circuit applies a current to the preamplifier circuit, and wherein the data input is reflected at the latch output; and
  de-asserting the clock input, wherein the current re-use circuit applies the current to the latch circuit, and wherein the latch output is maintained regardless of the state of the data input.

13. The method of claim 12, wherein the asserting the clock input includes asserting the clock input high.

14. The method of claim 12, wherein the asserting the clock input includes asserting the clock input low.

15. The method of claim 12, wherein the current re-use circuit includes:
  a first transistor pair;
  a second transistor pair; and
  wherein a first transistor of the first transistor pair and a first transistor of the second transistor pair are on when the clock input is asserted, and wherein a second transistor of the first transistor pair and a second transistor of the second transistor pair are on when the clock input is de-asserted.

16. The method of claim 12, wherein the latch circuit includes a differential output, and wherein the latch circuit includes a positive feedback loop driving the differential output.

17. A latched comparator circuit, the circuit comprising:
  a voltage rail;
  a differential data input having a differential input transistor pair, wherein the differential input is operable to provide a differential current in proportion to a difference between a first input and a second input;
  a preamplifier circuit connected to the differential data input;
  a latch circuit connected to the preamplifier circuit;
  a current re-use circuit that is coupled to the preamplifier circuit and to the latch circuit, wherein the current re-use circuit applies the differential current to the preamplifier circuit during a transparent phase, and wherein the current re-use circuit applies the differential current to the latch circuit during a latch phase; and
  a current source that is coupled between the current re-use circuit and the voltage rail.

18. The circuit of claim 17, wherein the latch circuit includes a differential output, and wherein the latch circuit includes a positive feedback loop driving the differential output.

19. The circuit of claim 17, wherein the circuit receives a clock signal, wherein the current re-use circuit includes:
  a first transistor pair;
  a second transistor pair; and
  wherein a first transistor of the first transistor pair and a first transistor of the second transistor pair is on when the clock signal are asserted high, and wherein a second transistor of the first transistor pair and a second transistor of the second transistor pair are on when the clock signal is asserted low.

20. The circuit of claim 19, wherein the differential current is applied to the preamplifier circuit when the clock signal is asserted, and wherein the differential current is applied to the latch circuit when the clock signal is de-asserted.

* * * * *